(12) United States Patent
Nishimura

(10) Patent No.: US 8,476,977 B2
(45) Date of Patent: *Jul. 2, 2013

(54) LCD DRIVING CIRCUIT USING OPERATIONAL AMPLIFIER AND LCD DISPLAY APPARATUS USING THE SAME

(75) Inventor: Kouichi Nishimura, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/613,248

(22) Filed: Sep. 13, 2012

(65) Prior Publication Data

US 2013/0002636 A1    Jan. 3, 2013

Related U.S. Application Data

(63) Continuation of application No. 12/836,148, filed on Jul. 14, 2010, now Pat. No. 8,289,079.

(30) Foreign Application Priority Data

Aug. 10, 2009    (JP) .................................. 2009-185451

(51) Int. Cl.
    *H03F 3/45*    (2006.01)
(52) U.S. Cl.
    USPC ........................................... 330/260; 330/51
(58) Field of Classification Search
    USPC ................. 330/51, 253, 255, 260; 345/204
    See application file for complete search history.

(56) References Cited

U.S. PATENT DOCUMENTS

| | | | |
|---|---|---|---|
| 6,424,219 | B1 | 7/2002 | Kato |
| 8,026,760 | B1 | 9/2011 | Prasad |
| 8,159,303 | B2 | 4/2012 | Nishimura et al. |
| 2009/0115522 | A1 | 5/2009 | Lyden et al. |

FOREIGN PATENT DOCUMENTS

JP    2002-175052 A1    6/2002

OTHER PUBLICATIONS

USPTO, Office Action, U.S. Appl. No. 12/836,148, May 8, 2012, 8 pages.
USPTO, Notice of Allowance, 12/836,148, Jun. 28, 2012, 4 pages.

*Primary Examiner* — Khanh V Nguyen
(74) *Attorney, Agent, or Firm* — Foley & Lardner LLP

(57) ABSTRACT

In an operational amplifier, a control unit switches an operation mode between first and second operation modes. A first output drive stage circuit section is configured to amplify a first input signal differentially-amplified by a first or a second input differential stage circuit section to output as a first drive voltage, similar to a second output drive stage circuit section. First and second power supplies: supply voltages in a first voltage range to the first differential stage circuit section and the first output drive stage circuit section in the first operation mode, supply voltages in the first voltage range to the second differential stage circuit section and the first output drive stage circuit section in the second operation mode, similar to third and fourth power supplies. The drive voltage on each of the first and second output nodes is fed back.

1 Claim, 9 Drawing Sheets

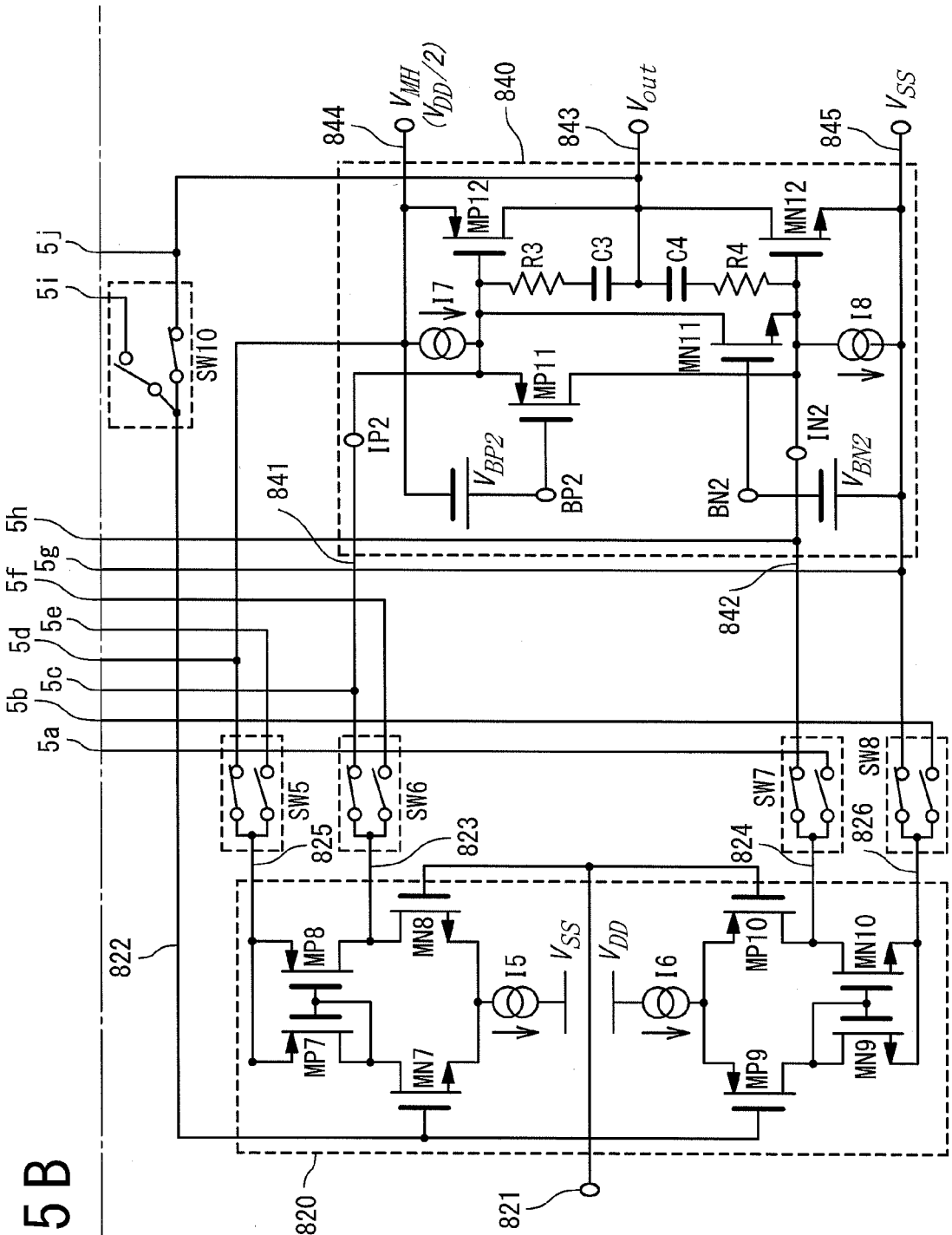

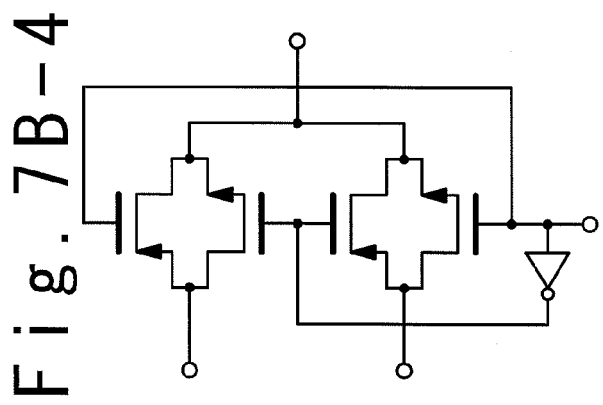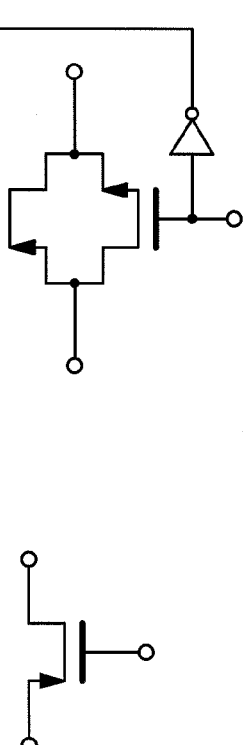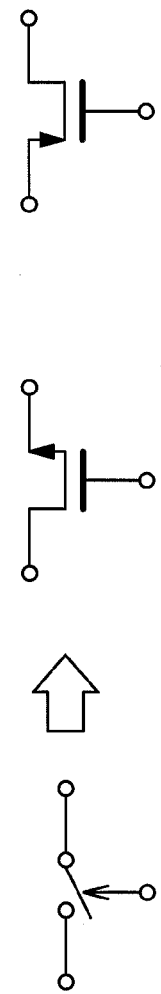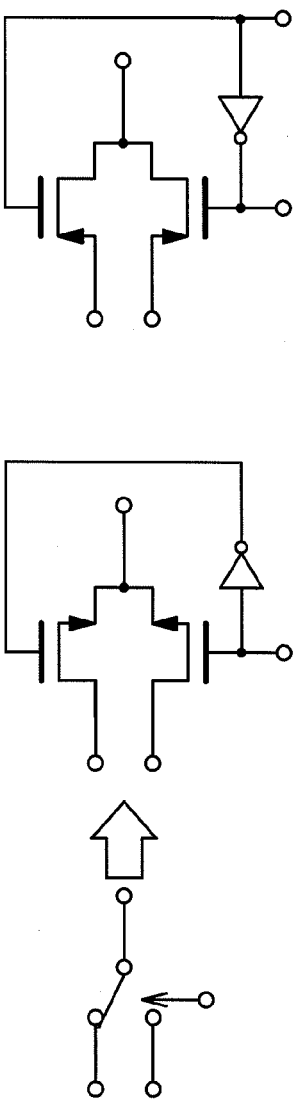
Fig.7A-1  Fig.7A-2  Fig.7A-3  Fig.7A-4
Fig.7B-1  Fig.7B-2  Fig.7B-3  Fig.7B-4

LCD DRIVING CIRCUIT USING OPERATIONAL AMPLIFIER AND LCD DISPLAY APPARATUS USING THE SAME

CROSS-REFERENCE TO RELATED PATENT APPLICATIONS

Japan Priority Application 2009-185451, filed Aug. 10, 2009 including the specification, drawings, claims and abstract, is incorporated herein by reference in its entirety. This application is a Continuation of U.S. application Ser. No. 12/836,148, filed Jul. 14, 2010, incorporated herein by reference in its entirety.

BACKGROUND OF THE INVENTION

1. Technical Field

The present invention relates to an operational amplifier, a driving circuit using the same, for a liquid crystal display apparatus and a liquid crystal display apparatus.

2. Background Art

A recent trend of a thin flat panel is toward more and more increasing in size. In particular, in the field of television, there is a situation where even a liquid crystal panel exceeding 100 inches is put into the market, and it is thought that the trend will never change. However, along with the increase in size of a liquid crystal panel, a data line load of a TFT LCD (Thin Film Transistor Liquid Crystal Display) becomes increasingly large, and therefore power consumed in an amplifier of an LCD driver that drives the TFT LCD tends to increase. Further, in order to reduce the number of LCD drivers to be used, the number of outputs of one chip tends to increase more and more. That is, a power consumption amount by one chip increases more and more. As a result, the power consumption amount as a whole of LCD drivers increases, and thereby a chip temperature abnormally rises.

Among measure for the temperature rising of a chip, one having been recently focused on is a method that reduces power consumed by a chip. In this method, a voltage $V_{DD}/2$ that is a half of a power supply voltage $V_{DD}$ is supplied to the chip, and an amplifier operates in the voltage $V_{DD}/2$.

However, as this method becomes widespread, there arise various circuit-based problems. For example, there is a problem that, in the case of a conventional circuit, if only a differential stage is operated in the range of $V_{SS}$ (GND) to $V_{DD}$, and an output stage is operated with the $V_{DD}/2$ power supply, a voltage balance cannot be maintained on the circuit operation, and therefore a desired characteristic cannot be obtained.

In conjunction with the above, Patent literature 1 (JP 2002-175052A) discloses an operational amplifier. The operational amplifier is intended to reduce a power consumption amount. In the following, referring to FIGS. 1 to 3, the conventional operational amplifier in the Patent literature 1 will be described.

FIG. 1 is a circuit diagram showing a configuration of the conventional operational amplifier circuit in the Patent literature 1. The conventional operational amplifier circuit is provided with two differential type input stage circuits 140 and 240, two drive stage circuits 130 and 230, four switch circuits 30, 40, 50, and 60, two P-channel MOS transistors MP180 and MP280 and two N-channel MOS transistors MN180 and MN280. It should be noted that each of the two differential type input stage circuits 140 and 240 and two drive stage circuits 130 and 230 is supplied with a power supply voltage ($V_{DD}$) and a power supply voltage ($V_{SS}$).

The drive stage circuit 130 is connected to an output terminal 110 through drains of the P-channel MOS transistor MP180 and the N-channel MOS transistor MN180. Similarly, the drive stage circuit 230 is connected to an output terminal 210 through drains of the P-channel MOS transistor MP280 and the N-channel MOS transistor MN280. A source of the P-channel MOS transistor MP180 is supplied with the power supply voltage $V_{DD}$. A source of the N-channel MOS transistor MN180 is supplied with a half ($V_{DD}/2$) of the power supply voltage $V_{DD}$. Also, a source of the P-channel MOS transistor MP280 is supplied with a half ($V_{DD}/2$) of the power supply voltage $V_{DD}$. A source of the N-channel MOS transistor MN280 is supplied with the power supply voltage $V_{SS}$.

The switch circuit 30 is provided with switches SW301 to SW304, and controls connections between output terminals 110 and 210 and odd-numbered and even-numbered terminals 310 and 320. The switch circuit 40 is provided with switches SW401 to SW404, and controls connections between terminals 410 and 420 and input terminals 120 and 220 of the differential type input stage circuits 140 and 240. It should be noted that the terminal 410 is supplied with a voltage INP from a positive-side DAC (digital analog converter), and the terminal 420 is supplied with a voltage INN from a negative-side DAC. The switch circuit 50 is provided with four switches SW501 to SW504, and controls connections between the differential type input stage circuits 140 and 240 and the drive stage circuits 130 and 230. The switch circuit 60 is provided with four switches SW601 to SW604, and controls connections between the output terminals 110 and 210 and input terminals 121 and 221 of the differential type input stage circuits 140 and 240.

The conventional operational amplifier circuit can use the switch circuits 30 to 60 to change a configuration of an amplifier circuit that drives the odd-numbered and even-numbered terminals 310 and 320. Specifically, in a pattern 1, the eight switches SW301, SW303, SW401, SW403, SW501, SW503, SW601, and SW603 are in an ON state, and the eight switches SW302, SW304, SW402, SW404, SW502, SW504, SW602, and SW604 are in an OFF state, and the pattern 1 and a pattern 2 opposite to the pattern 1 are switched to each other.

In the case of the pattern 1, the voltage INP is supplied from the positive-side DAC to an amplifier circuit including the differential type input stage circuit 140 and the drive stage circuit 130. Also, an output is outputted from the output terminal 110 to the odd-numbered terminal 310 as an odd-numbered output Vodd. At this time, the voltage INN is supplied from the negative-side DAC to an amplifier circuit including the differential type input stage circuit 240 and the drive stage circuit 230. Also, an output is outputted from the output terminal 210 to the even-numbered terminal 320 as an even-numbered output Veven.

On the other hand, in the case of the pattern 2, the voltage INP is supplied from the positive-side DAC to an amplifier circuit including the differential type input stage circuit 240 and the drive stage circuit 130. Also, an output is outputted from the output terminal 110 to the even-numbered terminal 320 as the even-numbered output Veven. At this time, the voltage INN is supplied from the negative-side DAC to an amplifier circuit including the differential type input stage circuit 140 and the drive stage circuit 230. Also, an output is outputted from the output terminal 210 to the odd-numbered terminal 310 as the odd-numbered output Vodd.

The conventional operational amplifier circuit operates as follows, to drive capacitive loads connected to the odd-numbered and even-numbered terminals 310 and 320. At this time, the differential type input stage circuits 140 and 240 and the drive stage circuits 130 and 230 operate in a voltage range of the positive power supply voltage $V_{DD}$ to the negative power supply voltage $V_{SS}$. Also, the MOS transistors MP180 and MN180 and the MOS transistors MP280 and MN280 are output transistors, and respectively operate in voltage ranges of $V_{DD}$ to $V_{DD}/2$ and $V_{DD}/2$ to $V_{SS}$. This results in the power consumption amount consumed in an output stage to be approximately halved.

FIG. 2 is a circuit showing a configuration of the differential type input stage circuit 140 shown in Patent literature 1. The differential type input stage circuit 140 is provided with six P-channel MOS transistors MP101, MP102, MP103, MP104, MP105, and MP106, and four N-channel MOS transistors MN101, MN102, MN103, and MN104. It should be noted that sources of the four P-channel MOS transistors MP103, MP104, MP105, and MP106 are connected with the positive power supply voltage $V_{DD}$. Sources of the two N-channel MOS transistors MN103 and MN104 are connected with the negative power supply voltage $V_{SS}$. Sources of the two N-channel MOS transistors MN101 and MN102 are connected to the power supply voltage $V_{SS}$ through a constant current source I101. Sources of the two P-channel MOS transistors MP101 and MP102 are connected to the power supply voltage $V_{DD}$ through a constant current source I102.

The two P-channel MOS transistors MP101 and MP102 constitutes a differential pair. The two N-channel MOS transistors MN103 and MN104 constitute an active load for the differential pair.

Also, the two N-channel MOS transistors MN101 and MN102 constitutes a differential pair. The two P-channel MOS transistors MP103 and MP104 and the two P-channel MOS transistors MP105 and MP106 respectively constitute current mirror circuits. Outputs of the current mirror circuits are connected to drains of the two N-channel MOS transistors MN103 and MN104.

Further, the input terminal 120 is connected to respective gates of the N-channel MOS transistor MN101 and the P-channel MOS transistor MP102. The input terminal 121 is connected to respective gates of the N-channel MOS transistor MN102 and the P-channel MOS transistor MP101.

Also, respective drains of the N-channel MOS transistor MN104 and the P-channel MOS transistor MP106 are connected to the two switches SW501 and SW502 through a terminal 123.

Based on such a configuration, differential input signals supplied to the input terminals 120 and 121 are subjected to conversion, and then outputted from the terminal 123.

A configuration and an operation of the differential type input circuit 240 are the same as those described above. However, it should be noted that the two input terminals 120 and 121, a terminal 123, and two switches SW501 and SW502 should be replaced by the two input terminals 220 and 221, a terminal 223, and switches SW503 and SW504, respectively.

FIG. 3 is a circuit showing a configuration of the conventional drive stage circuit 130. The drive stage circuit 130 is provided with three P-channel MOS transistors MP107 to MP109, an N-channel MOS transistor MN105, a P-channel MOS transistor MP110, and two constant current sources 103 and 104. It should be noted that a source of each of the three P-channel MOS transistors MP107 to MP109 is supplied with the power supply voltage $V_{DD}$. A source of the N-channel MOS transistor MN105 is supplied with the power supply voltage $V_{SS}$. Each of the two constant current sources 103 and 104 is supplied with the power supply voltage $V_{SS}$.

A gate of the N-channel MOS transistor MN105 is connected to the two switches SW501 and SW502 through a terminal 131. A drain of the N-channel MOS transistor MN105 is connected to a drain of the P-channel MOS transistor MP107.

The P-channel MOS transistor MP107 constitutes a current mirror circuit with each of the P-channel MOS transistors MP108 and MP109. A drain of the P-channel MOS transistor MP108 is connected to the constant current source 103 through the P-channel MOS transistor MP110. A gate of the P-channel MOS transistor MP110 is connected to a gate of the P-channel MOS transistor MP180. A drain of the P-channel MOS transistor MP109 is connected to a gate of the N-channel MOS transistor MN180 and the constant current source 104.

According to such a configuration, in the drive stage circuit 130, an input voltage supplied from the terminal 131 is received by the N-channel MOS transistor MN105, of which output drives the P-channel MOS transistor MP180 and the N-channel MOS transistor MN180. That is, a composite output signal according to an input signal from the terminal 131 is outputted from the terminal 110.

The drive stage circuit 230 also has the same configuration and operation. However, it should be noted that the P-channel MOS transistor MP280, the N-channel MOS transistor MN280, the terminal 132, and two switches SW501 and SW503 should be replaced by the P-channel MOS transistor MP280, the N-channel MOS transistor MN280, the terminal 231, and two switches SW502 and SW504, respectively.

CITATION LIST

[Patent literature 1]: JP 2002-175052A

SUMMARY OF THE INVENTION

In the above-described conventional example, it is very difficult to configure an interface with a circuit having a so-called combined differential stage including typical P-channel and N-channel differential stages. This problem occurs because an interface between the differential stage and the output stage is configured only on the basis of one system.

Referring to FIGS. 1 and 3, attention is focused on the two differential type input stage circuits 140 and 240. Between the case where a differential pair including the two NMOS transistors MN101 and MN102 operates and the case where a differential pair including the two PMOS transistors MP101 and MP102 operates, the number of transistors in a current path is different. For this reason, symmetry of output characteristics between the two drive stage circuits 130 and 230 is lost.

It should be noted that the symmetry of output characteristics is defined as follows. That is, if a difference between a rising time and a falling time of an output pulse is small, it is defined that the symmetry is good. On the other hand, if the difference between the rising time and the falling time is large, it is defined that the symmetry is poor.

For example, in FIG. 1, a rising time Tr1 and a falling time Tf1 of a pulse in an output signal OUTP outputted from the odd-numbered terminal 310 (or even-numbered terminal 320) exhibit different values. If an output signal having such an asymmetric pulse shape drives a capacitive load such as a liquid crystal display apparatus, charging/discharging characteristics to/from the capacitive load are degraded. This sort of operational amplifier circuit may not meet specifications of an LCD driver.

In an aspect of the present invention, an operational amplifier includes: a control unit configured to switch an operation mode between first and second operation modes; an input section configured to receive input signals and supply one of the input signals as a first input signal to a first input node in the first operation mode and to a second input node in the second operation mode and the other of the input signals as a second input signal to the first input node in the second operation mode and to the second input node in the first operation mode; a first differential stage circuit section configured to differentially-amplify the first input signal supplied through the first input node in the first operation mode, and the second input signal supplied through the first input node in the second operation mode; a second differential stage circuit section configured to differentially-amplify the second input signal supplied through the second input node in the first operation mode, and the first input signal supplied through the second input node in the second operation mode; a first output drive stage circuit section configured to amplify the first input signal differentially-amplified by the first or second input differential stage circuit section to output as a first drive voltage; a second output drive stage circuit section configured to amplify the second input signal differentially-amplified by the first or second input differential stage circuit sections to output as a second drive voltage; an output section configured to output through a first output node, the first drive voltage in the first operation mode and the second drive voltage in the second operation mode, and to output through a second output node, the second drive voltage in the first operation mode and the first drive voltage in the second operation mode; first and second power supplies configured to supply voltages in a first voltage range to the first differential stage circuit section and the first output drive stage circuit section in the first operation mode, and to supply voltages in the first voltage range to the second differential stage circuit section and the first output drive stage circuit section in the second operation mode; and third and fourth power supplies configured to supply voltages in a second voltage range which is different from the first voltage range, to the second differential stage circuit section and the second output drive stage circuit section in the first operation mode, and to supply voltages in the second voltage range in the first differential stage circuit section and the second output drive stage circuit section in the second operation mode. The first or second drive voltage on the first output node is fed back to the first differential stage circuit section from one of the first and second output drive stage circuit sections, and the first or second drive voltage on the second output node is fed back to the second differential stage circuit section from the other of the first and the second output drive stage circuit section.

In another aspect of the present invention, a driving circuit for a liquid crystal display apparatus, includes: a plurality of operational amplifiers.

In still another aspect of the present invention, a method of an operational amplification, is achieved by (a) switching an operation mode between first and a second operation mode; by (b) supplying voltages in a first voltage range by first and second power supplies to a first input differential stage circuit section and a first output drive stage circuit section, and voltage in a second voltage range, which is different from the first voltage range, by third and fourth power supplies to a second input differential stage circuit section and a second output drive stage circuit section, in the first operation mode; by (c) supplying voltages in the first voltage range to the second input differential stage circuit section and the first output drive stage circuit section, and voltages in the second voltage range to the first input differential stage circuit section and the second output drive stage circuit section in the second operation mode; by (d) inputting first and second input signals; by (e) supplying voltages in the first voltage range to the first input differential stage circuit section and the first output drive stage circuit section, and voltages in the second voltage range to the second input differential stage circuit section and the second output drive stage circuit section, in the first operation mode; by (f) supplying voltages in the first voltage range to the second input differential stage circuit section and the first output drive stage circuit section, and voltages in the second voltage range to the first input differential stage circuit section and the second output drive stage circuit section, in the second operation mode; by (g) differentially-amplifying the first input signal by the first input differential stage circuit section, and the second input signal by the second input differential stage circuit section, in the first operation mode; by (h) differentially-amplifying the second input signal by the first input differential stage circuit section and the first input signal by the second input differential stage circuit section, in the second operation mode; by (i) amplifying the first input signal differentially-amplified in the (g) or (h), by the first output drive stage circuit section; by (j) amplifying the second input signal differentially-amplified in the (g) or (h), by the second output drive stage circuit section; by (k) outputting the first and second drive voltages obtained in the (i) or (j) from the first and second output sections in the first operation mode, respectively; by (l) outputting the first and second drive voltages obtained in the (i) or (j) from the second and first output sections in the second operation mode, respectively; by (m) feeding back one of the first and second drive voltages outputted from the first output section in the (k) or (l) to the first input differential stage circuit section; and by (n) feeding back the other of the first and second drive voltages outputted from the second output section in the (k) or (l) to the second input differential stage circuit section.

According to the present invention, two input differential stage circuits and the two output drive stage circuits are respectively supplied with voltages from the two power supply voltages having a different voltage range. The voltage ranges of the two power supply voltages are configured such that a summation of the voltage range can meet a voltage range necessary for an output operation of a subsequent stage circuit. As a result, a supply voltage can be reduced, and a full output operation of the subsequent stage circuit can be performed.

BRIEF DESCRIPTION OF THE DRAWINGS

The above and other objects, advantages and features of the present invention will be more apparent from the following description of certain embodiments taken in conjunction with the accompanying drawings, in which:

FIGS. 5A and 5B are a circuit diagram showing a configuration of an operational amplifier circuit section in the operational amplifier according to the first embodiment of the present invention;

FIG. 7A-1 is a circuit diagram schematically illustrating a make type switch circuit section;

FIG. 7A-2 is a circuit diagram showing the make type switch circuit section of an N-channel MOS transistor;

FIG. 7A-3 is a circuit diagram showing the make type switch circuit section of a P-channel MOS transistor;

FIG. 7A-4 is a circuit diagram for realizing the make type switch circuit section of two types of MOS transistors;

FIG. 7B-1 is a circuit diagram schematically illustrating a transfer switch circuit section;

FIG. 7B-2 is a circuit diagram showing the transfer switch circuit section of N-channel MOS transistors;

FIG. 7B-3 is a circuit diagram showing the transfer switch circuit section of P-channel MOS transistors; and FIG. 7B-4 is a circuit diagram showing the transfer switch circuit section with two types of MOS transistors.

DESCRIPTION OF THE EMBODIMENTS

Hereinafter, a liquid crystal display (LCD) driving circuit including an operational amplifier according to the present invention, and a liquid crystal display apparatus driven by the LCD driving circuit will be described with reference to the attached drawings.

First Embodiment

Figure 4:
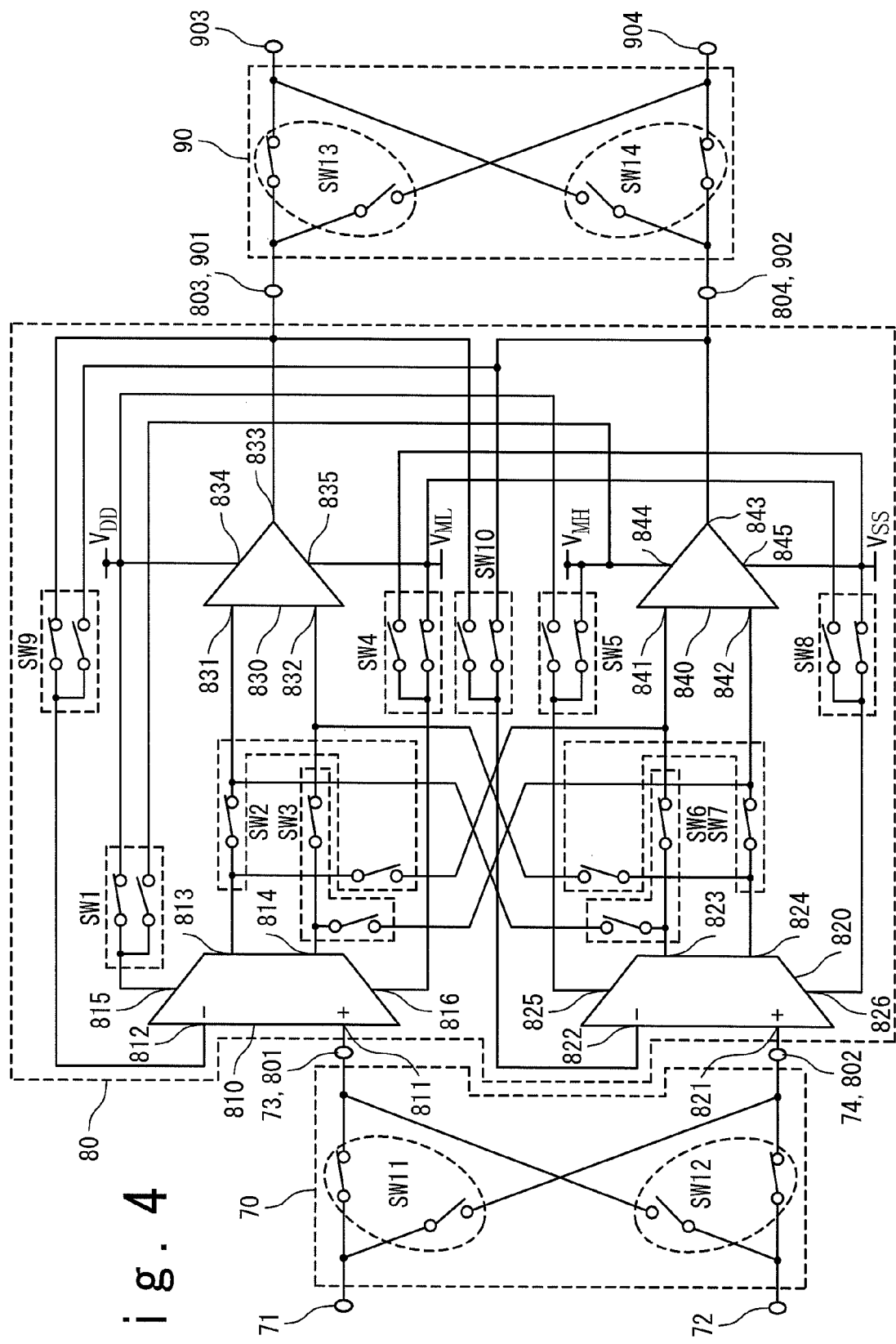
FIG. 4 is a circuit showing a configuration of an operational amplifier according to a first embodiment of the present invention.

FIG. 4 is a circuit showing a configuration of the operational amplifier according to a first embodiment of the present invention. Referring to FIG. 4, the operational amplifier according to the present embodiment will be described. The operational amplifier according to the present embodiment is provided with an input switching circuit section 70, an operational amplifier circuit section 80, and an output switching circuit section 90.

The input switching circuit section 70 is provided with first and second input nodes 71 and 72, first and second input transfer switch circuit sections SW11 and SW12, and first and second output nodes 73 and 74.

The operational amplifier circuit section 80 is provided with first and second input nodes 801 and 802, first and second input differential stage circuit sections 810 and 820, first and second output drive stage circuit sections 830 and 840, first to fourth power supply voltages $V_{DD}$, $V_{ML}$, $V_{MH}$, and $V_{SS}$, first and second output nodes 803 and 804, and first to tenth transfer switch circuit sections SW1 to SW10. It should be noted that voltages supplied from the power supply voltages $V_{ML}$ and $V_{MH}$ are both around a half of the voltage supplied from the power supply voltage $V_{DD}$. The first output drive stage circuit section 830 is a positive only output stage which outputs a voltage of in a voltage range of $V_{DD}$ to $V_{ML}$, whereas the second output drive stage circuit section 840 is a negative only output stage which outputs a voltage of $V_{MH}$ to $V_{SS}$.

The first input differential stage circuit section 810 is provided with first and second input nodes 811 and 812, first and second output nodes 813 and 814, a positive voltage input node 815, and a negative voltage input node 816. It should be noted that the first input node 811 is a non-inversion input node, and the second input node 812 is an inversion input node. The second input differential stage circuit section 820 is provided with first and second input nodes 821 and 822, first and second output nodes 823 and 824, a positive voltage input node 825, and a negative voltage input node 826. It should be noted that the first input node 821 is a non-inversion input node, and the second input node 822 is an inversion input section.

The first output drive stage circuit section 830 is provided with first and second input nodes 831 and 832, an output node 833, a positive voltage input node 834, and a negative voltage input node 835. The second output drive stage circuit section 840 is provided with first and second input nodes 841 and 842, an output node 843, a positive voltage input node 844, and a negative voltage input node 845.

The output switching circuit section 90 is provided with first and second input nodes 901 and 902, thirteenth and fourteenth transfer switch circuit sections SW13 and SW14, and first and second output nodes 903 and 904. The first and second output nodes 903 and 904 are respectively in charge of odd-numbered output and even-numbered output, which are to be described later. It should be noted that the combination of the outputs may be switched.

Each of the first to fourteenth transfer switch circuit sections SW1 to SW14 is provided with a common terminal, a first terminal, and a second terminal. Also, each of the first to fourteenth transfer switch circuit sections SW1 to SW14 has a first state and a second state. In each of the first to fourteenth transfer switch circuit sections SW1 to SW14 in the first state, the common terminal and the first terminal are made conductive to each other, whereas the common terminal and the second terminal are insulated from each other. On the other hand, in each of the first to fourteenth transfer switch circuit sections SW1 to SW14 in the second state, the common terminal and the first terminal are insulated from each other, whereas the common terminal and the second terminal are made conductive to each other. It should be noted that, in FIG. 4, the first to fourteenth transfer switch circuit sections SW1 to SW14 are represented as being in the first state. In the following, the first terminal and the second terminal of each of the first to fourteenth transfer switch circuit sections SW1 to SW14 are respectively described as a break terminal and a make terminal.

Here, connection relation between the components of the operational amplifier according to the present embodiment will be described.

The first input node 71 of the input switching circuit section 70 is connected to a positive DAC (Digital to Analog Converter) (not shown). The first input node 71 of the input switching circuit section 70 is further connected to the common terminal of the eleventh transfer switch SW11. The break terminal of the eleventh transfer switch SW11 is connected to the first output node 73 of the input switching circuit section 70. The make terminal of the eleventh transfer switch SW11 is connected to the second output node 74 of the input switching circuit section 70.

The second input node 72 of the input switching circuit section 70 is connected to a negative DAC (not shown). The second input node 72 of the input switching circuit section 70 is further connected to the common terminal of the twelfth transfer switch SW12. The make terminal of the twelfth transfer switch SW12 is connected to the first output node 73 of the input switching circuit section 70. The break terminal of the eleventh transfer switch SW11 is connected to the second output node 74 of the input switching circuit section 70.

The first and second output nodes 71 and 72 in the input switching circuit section 70 are respectively connected to the first and second input nodes 801 and 802 in the operational amplifier circuit section 80.

The first input nodes 801 and 802 in the operational amplifier circuit section 80 are connected to the first input node 811 of the first input differential stage circuit section 810 and the first input node 821 of the second input differential stage circuit section 820.

The first output node 813 of the first input differential stage circuit section 810 is connected to the common terminal of the second transfer switch circuit section SW2. The second output node 814 of the first input differential stage circuit section 810 is connected to the common terminal of the third transfer switch circuit section SW3. The first output node 823 of the second input differential stage circuit section 820 is connected to the common terminal of the sixth transfer switch circuit section SW6. The second output node 824 of the second input differential stage circuit section 820 is connected to the common terminal of the seventh transfer switch circuit section SW7.

The voltage input node 815 of the first input differential stage circuit section 810 is connected to the common terminal of the first transfer switch circuit section SW1. The voltage input node 816 of the first input differential stage circuit section 810 is connected to the common terminal of the fourth transfer switch circuit section SW4. The voltage input node 825 of the second input differential stage circuit section 820 is connected to the common terminal of the fifth transfer switch circuit section SW5. The voltage input node 826 of the second input differential stage circuit section 820 is connected to the common terminal of the eighth transfer switch circuit section SW8.

The second input section of the first input differential stage circuit section 810 is connected with the common terminal of the ninth transfer switch circuit section SW9. The second input section of the second input differential stage circuit section 820 is connected with the common terminal of the tenth transfer switch circuit section SW10.

A first input node 831 of the first output drive stage circuit section 830 is connected to the break terminal of the second transfer switch circuit section SW2 and the make terminal of the sixth transfer switch circuit section SW6. A second input node 832 of the first output drive stage circuit section 830 is connected to the break terminal of the third transfer switch circuit section SW3 and the make terminal of the seventh transfer switch circuit section SW7. A first input node 841 of the second output drive stage circuit section 840 is connected to the break terminal of the sixth transfer switch circuit section SW6 and the make terminal of the second transfer switch circuit section SW2. A second input node 842 of the second output drive stage circuit section 840 is connected to the break terminal of the seventh transfer switch circuit section SW7 and the make terminal of the third transfer switch circuit section SW3.

An output node 833 of the first output drive stage circuit section 830 is connected to the first output node 803 of the operational amplifier circuit section 80, the break terminal of the ninth transfer switch circuit section SW9, and the make terminal of the tenth transfer switch circuit section SW10. An output node 843 of the second output drive stage circuit section 840 is connected to the second output node 804 of the operational amplifier circuit section 80, the break terminal of the tenth transfer switch circuit section SW10, and the make terminal of the ninth transfer switch circuit section SW9.

The voltage input node 834 of the first output drive stage circuit section 830 is connected to the first power supply voltage $V_{DD}$, the break terminal of the first transfer switch circuit section SW1, and the make terminal of the fifth transfer switch circuit section SW5. The voltage input node 835 of the first output drive stage circuit section 830 is connected to the second power supply $V_{ML}$, the break terminal of the fourth transfer switch circuit section SW4, and the make terminal of the eighth transfer switch circuit section SW8. The voltage input node 844 of the second output drive stage circuit section 840 is connected to the third power supply $V_{MH}$, the break terminal of the fifth transfer switch circuit section SW5, and the make terminal of the first transfer switch circuit section SW1. The voltage input node 845 of the second output drive stage circuit section 840 is connected to the fourth power supply $V_{SS}$, the break terminal of the eighth transfer switch circuit section SW8, and the make terminal of the fourth transfer switch circuit section SW4.

The first output node 803 of the operational amplifier circuit section 80 is connected to the first input node 901 of the output switching circuit section 90. The second output node 804 of the operational amplifier circuit section 80 is connected to the second input node 902 of the output switching circuit section 90.

The first input node 901 of the output switching circuit section 90 is connected to the common terminal of the thirteenth transfer switch circuit section SW13. The second input node 902 of the output switching circuit section 90 is connected to the common terminal of the fourteenth transfer switch circuit section SW14. The break terminal of the thirteenth transfer switch circuit section SW13 and the make terminal of the fourteenth transfer switch circuit section SW14 are connected to the first output node 903 of the output switching circuit section 90. The make terminal of the thirteenth transfer switch circuit section SW13 and the break terminal of the fourteenth transfer switch circuit section SW14 are connected to the second output node 904 of the output switching circuit section 90.

Here, the LCD driving circuit according to the present invention will be described. The LCD driving circuit according to the present invention is provided with a plurality of the operational amplifiers according to the present embodiment.

In general, in a liquid crystal display apparatus, a plurality of liquid crystal cells are arranged in a matrix. Also, in general, the LCD driving circuit controls the plurality of liquid crystal cells in units of rows or columns. Accordingly, the plurality of operational amplifiers in the LCD driving circuit according to the present invention are connected in parallel.

Further, the LCD driving circuit according to the present invention controls the plurality of liquid crystal cells in units of two rows or two columns. It is preferable for the control to alternatively apply positive and negative voltages to liquid crystal cells in two rows or columns.

Next, an operation of the operational amplifier according to the present embodiment will be described.

First, an operation common to the first to fourteenth transfer switch circuit sections SW1 to SW14 will be described. Each of the transfer switch circuit sections has the two states. That is, each of the transfer switch circuit sections transits between the first state that the common terminal is made conductive to the first terminal and insulated from the second terminal and the second state that the common terminal is made conductive to the second terminal and insulated from the first terminal. It should be noted that, preferably, the operational amplifier according to the present embodiment is further provided with a control circuit section (not shown), and the control circuit section controls states of the first to fourteenth transfer switch circuit sections SW1 to SW14.

Next, in the entire operational amplifier, all the first to fourteenth transfer switch circuit sections SW1 to SW14 are in either the first state or the second state. That is, even as the operational amplifier, the transition between the two states is made. It should be noted that FIG. 4 illustrates the operational amplifier in the first state.

In the operational amplifier in the first state, the first input differential stage circuit section 810 and the first output drive stage circuit section 830 operate as an operational amplifier.

In this case, a signal from the positive DAC (not shown) is outputted to an odd-numbered output node.

First, the signal supplied from the positive DAC (not shown) to the first input node 71 in the input switching circuit section 70 is transferred to the first input node 811 of the first input differential stage circuit section 810 through the eleventh transfer switch circuit section SW11. At this time, the first and second output nodes 813 and 814 of the first input differential stage circuit section 810 are connected to the first and second input nodes 831 and 832 in the first output drive stage circuit section 830 through the second and third transfer switch circuit sections SW2 and SW3, respectively. Also, at this time, the output node 833 of the first output drive stage circuit section 830 is connected to the first output node 903 of the output switching circuit section 90 through the thirteenth transfer switch circuit section SW13.

Also, the output node 833 of the first output drive stage circuit section 830 is connected to the second input node 812 of the first input differential stage circuit section 810 through the ninth transfer switch circuit section SW9. Accordingly, the first input differential stage circuit section 810 and the first output drive stage circuit section 830 operate as a voltage follower circuit. Here, supposing that an input voltage of the first input section of the first input differential stage circuit section 810 is denoted by Vin, and an output voltage of the output section of the first output drive stage circuit section 830 is denoted by Vout, $$Vin=Vout.$$

Further, the voltage input nodes 815 and 816 of the first input differential stage circuit section 810 are connected with first and second power supply voltages $V_{DD}$ and $V_{ML}$ through the first and fourth transfer switch circuit sections SW1 and SW4, respectively.

In the operational amplifier in the first state, simultaneously with the above, the second input differential stage circuit section 820 and the second output drive stage circuit section 840 operate as an operational amplifier. In this case, a signal from the negative DAC (not shown) is outputted to an even-numbered output node.

First, the signal supplied from the negative DAC (not shown) to the second input node 72 of the input switching circuit section 70 is transferred to the first input node 821 of the second input differential stage circuit section 820 through the twelfth transfer switch circuit section SW12. At this time, the first and second output nodes 823 and 824 of the second input differential stage circuit section 820 are connected to the first and second input nodes 841 and 842 in the second output drive stage circuit section 840 through the sixth and seventh transfer switch circuit sections SW6 and SW7, respectively. Also, at this time, the output node 843 of the second output drive stage circuit section 840 is connected to the second output node 904 of the output switching circuit section 90 through the fourteenth transfer switch circuit section SW14.

Also, the output node 843 of the second output drive stage circuit section 840 is further connected to the second input node 822 of the second input differential stage circuit section 820 through the tenth transfer switch circuit section SW10. Accordingly, the second input differential stage circuit section 820 and the second output drive stage circuit section 840 operate as a voltage follower circuit. Here, supposing that an input voltage of the first input section of the second input differential stage circuit section 820 is denoted by Vin, and an output voltage of the output section of the second output drive stage circuit section 840 is denoted by Vout, $$Vin=Vout.$$

Further, the voltage input nodes 825 and 826 in the second input differential stage circuit section 820 are connected with third and fourth power supply voltages $V_{MH}$ and $V_{SS}$ through the fifth and eighth transfer switch circuit sections SW5 and SW8, respectively.

In the operational amplifier in the second state, the second input differential stage circuit section 820 and the first output drive stage circuit section 830 operate as an operational amplifier. In this case, the signal from the positive DAC (not shown) is outputted to the even-numbered output terminal.

First, the signal supplied from the positive DAC (not shown) to the first input node 71 of the input switching circuit section 70 is supplied to the first input node 821 of the second input differential stage circuit section 820 through the eleventh transfer switch circuit section SW11. At this time, the first and second output nodes 823 and 824 of the second input differential stage circuit section 820 are connected to the first and second input nodes 831 and 832 in the first output drive stage circuit section 830 through the sixth and seventh transfer switch circuit sections SW6 and SW7, respectively. Also, at this time, the output node 833 of the first output drive stage circuit section 830 is connected to the second output node 904 of the output switching circuit section 90 through the thirteenth transfer switch circuit section SW13.

Also, the output node 833 of the first output drive stage circuit section 830 is connected to the second input node 822 of the second input differential stage circuit section 820 through the tenth transfer switch circuit section SW10. Accordingly, the second input differential stage circuit section 820 and the first output drive stage circuit section 830 operate as a voltage follower connected operational amplifier. Here, given that an input voltage at the first input section of the second input differential stage circuit section 820 is denoted by Vin, and an output voltage at the output section of the first output drive stage circuit section 830 is denoted by Vout, $$Vin=Vout.$$

Further, the voltage input nodes 825 and 826 in the second input differential stage circuit section 820 are connected with the first and second power supply voltages $V_{DD}$ and $V_{ML}$ through the fifth and eighth transfer switch circuit sections SW5 and SW8, respectively.

In the operational amplifier in the second state, simultaneously with the above, the first input differential stage circuit section 810 and the second output drive stage circuit section 840 operate as an operational amplifier. In this case, the signal from the negative DAC is transferred to the odd-numbered output terminal.

First, the signal supplied from the negative DAC (not shown) to the second input node 72 of the input switching circuit section 70 is transferred to the first input node 811 of the first input differential stage circuit section 810 through the twelfth transfer switch circuit section SW12. At this time, the first and second output nodes 813 and 814 of the first input differential stage circuit section 810 are connected to the first and second input nodes 841 and 842 in the second output drive stage circuit section 840 through the second and third transfer switch circuit sections SW2 and SW3, respectively. Also, at this time, the output node 843 of the second output drive stage circuit section 840 is connected to the first output node 903 of the output switching circuit section 90 through the fourteenth transfer switch circuit section SW14.

Also, the output node 843 of the second output drive stage circuit section 840 is further connected to the second input node 812 of the first input differential stage circuit section 810 through the ninth transfer switch circuit section SW9.

Accordingly, the first input differential stage circuit section 810 and the second output drive stage circuit section 840 operate as a voltage follower connected operational amplifier. Here, supposing that an input voltage at the first input section of the first input differential stage circuit section 810 is denoted by Vin, and an output voltage at the output section of the second output drive stage circuit section 840 is denoted by Vout, $$Vin=Vout.$$

Further, the voltage input nodes 815 and 816 in the first input differential stage circuit section 810 are connected with the third and fourth power supply voltages $V_{MH}$ and $V_{SS}$ through the first and fourth transfer switch circuit sections SW1 and SW4, respectively.

In general, in the LCD driving circuit, it is necessary to alternately apply positive and negative outputs to the liquid crystal cell to prevent an LCD from being burned. For this purpose, in the case of such a positive/negative only amplifier configuration, the polarity switches are required between the output terminal and a drain line of the LCD. For this reason, the cross switch 90 (of the thirteenth and fourteenth switches SW13 and SW14 in FIG. 4) is inserted between positive and negative only output stages and the LCD drain line. Further, the input switching circuit section 70 is inserted between positive and negative DAC outputs of a previous stage connected to the operational amplifier and differential stages A 810 and B 820.

As described, when the positive DAC output is supplied to the differential stage A/B 810, 820, positive and negative side power supply voltages of the differential stage A/B 810, 820 are $V_{DD}$ and $V_{ML}$, respectively. On the other hand, when the negative DAC output is supplied, the positive and negative side power supply voltages of the differential stage A/B are $V_{MH}$ and $V_{SS}$ (GND), respectively.

Here, the above-described voltages $V_{ML}$ and $V_{MH}$ are connected in common, and made equal to the voltage of approximately $V_{DD}/2$. That is, there is an application in which the operation is performed with one power supply voltage.

The power supply voltage of the two differential stages 810 and 820 are limited, and therefore input voltage ranges of them are obviously limited. By switching the power supply voltages of the differential stages 810 and 820 based on an input voltage range, a normal operation is consequently performed in the entire input voltage range ($V_{SS}$ (GND) to $V_{DD}$).

Similarly, the power supply voltages of the two output stages 830 and 840 are limited, and therefore output voltage ranges of them are obviously limited. By switching the positive and negative only output stages based on an output voltage range, an entire output voltage range ($V_{SS}$ (GND) to $V_{DD}$) can be consequently outputted to an odd-numbered output terminal/even-numbered output terminal.

Here, it should be noted that the voltage of $V_{DD}/2$ is not necessarily a half of the power supply voltage, but $V_{DD}/2+\Delta V$ is also acceptable in terms of an operable range. In addition, typically, $\Delta V$ may be around a few volts.

Next, the operation of the LCD driving circuit according to the present invention will be described.

Preferably, the plurality of operational amplifiers that are arranged in parallel in the LCD driving circuit according to the present invention all operate synchronously. That is, in all of the operational amplifiers, switching between the first and second operation modes is preferably made synchronously. For this purpose, preferably, a control unit (not shown) controls all of the operational amplifiers.

Figure 5A:
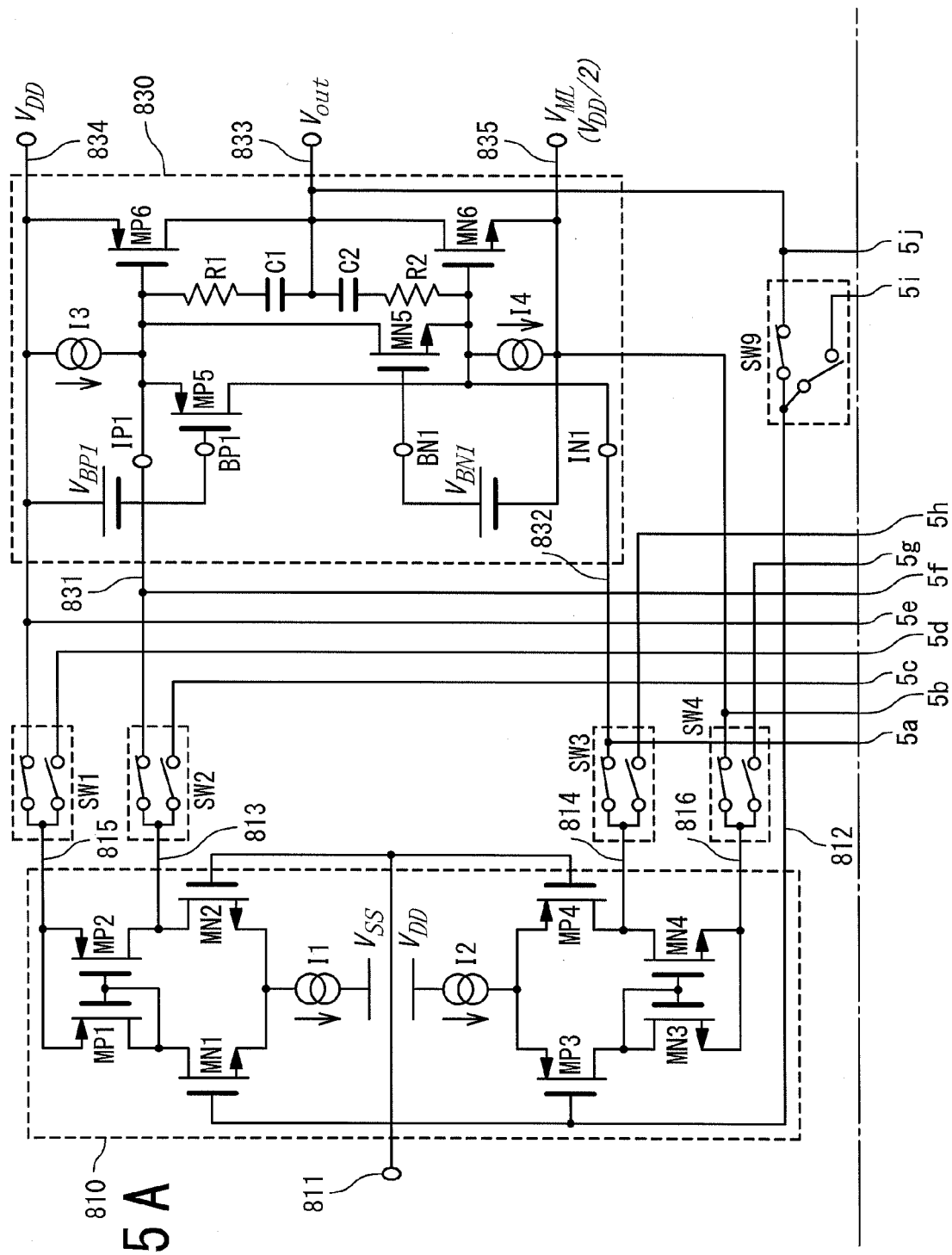

FIGS. 5A and 5B are circuit diagrams showing a configuration of the operational amplifier circuit section 80 according to the first embodiment of the present invention. It should be noted that FIGS. 5A and 5B illustrate one circuit diagram separated into two diagrams. Reference numerals 5a to 5j are notations for specifying ten lines divided between the both diagrams.

The first input differential stage circuit section 810 is provided with first and second constant current sources I1 and I2, first to fourth P-channel MOS transistors MP1 to MP4, and first to fourth N-channel MOS transistors MN1 to MN4. The first output drive stage circuit section 830 is provided with third and fourth constant current sources I3 and I4, first and second bias voltage sources $V_{BP1}$ and $V_{BN1}$, fifth and sixth P-channel MOS transistors MP5 and MP6, fifth and sixth N-channel MOS transistors MN5 and MN6, first and second resistances R1 and R2, and first and second capacitances C1 and C2. The second input differential stage circuit section 820 is provided with fifth and sixth constant current sources I5 and I6, seventh to tenth P-channel MOS transistors MP7 to MP10, and seventh to tenth N-channel MOS transistors MN7 to MN10. The second output drive stage circuit section 840 is provided with seventh and eighth constant current sources I7 and I8, third and fourth bias voltage sources $V_{BP2}$ and $V_{BN2}$, eleventh and twelfth P-channel MOS transistors MP11 and MP12, eleventh and twelfth N-channel MOS transistors MN11 and MN12, third and fourth resistances R3 and R4, and third and fourth capacitances C3 and C4.

In the first input differential stage circuit section 810, one terminal of the first constant current source I1 is connected to the fourth power supply $V_{SS}$. The other terminal of the first constant current source I1 is connected to sources of the first and second N-channel MOS transistors MN1 and MN2. A drain of the first N-channel MOS transistor MN1 is connected to a drain and gate of the first P-channel MOS transistor MP1 and a gate of the second P-channel MOS transistor MP2. A drain of the second N-channel MOS transistor MN2 is connected to a drain of the second P-channel MOS transistor MP2 and the common terminal of the second transfer switch circuit section SW2. Sources of the first and second P-channel MOS transistors MP1 and MP2 are connected to the common terminal of the first transfer switch circuit section SW1. A gate of the first N-channel MOS transistor MN1 is connected to a gate of the third P-channel MOS transistor MP3 and the second input node 812 of the first input differential stage circuit section 810. A gate of the second N-channel MOS transistor MN2 is connected to a gate of the fourth P-channel MOS transistor MP4 and the first input node 811 of the first input differential stage circuit section 810. One terminal of the second constant current source I2 is connected to the first power supply voltage $V_{DD}$. The other terminal of the second constant current source I2 is connected to sources of the third and fourth P-channel MOS transistors MP3 and MP4. A drain of the third P-channel MOS transistor MP3 is connected to a drain and a gate of the third N-channel MOS transistor MN3 and a gate of the fourth N-channel MOS transistor MN4. A drain of the fourth P-channel MOS transistor MP4 is connected to a drain of the fourth N-channel MOS transistor MN4 and the common terminal of the third transfer switch circuit section SW3. Sources of the third and fourth N-channel MOS transistors MN3 and MN4 are connected to the common terminal of the fourth transfer switch circuit section SW4.

Connection relation between the respective components in the second input differential stage circuit section 820 is the same as that of the above-described first input differential stage circuit section 810, and therefore detailed description of them is omitted. However, it should be noted that the first to fourth P-channel MOS transistors MP1 to MP4 should be replaced by the seventh to tenth P-channel MOS transistors MP7 to MP10, the first to fourth N-channel MOS transistors MN1 to MN4 by the seventh to tenth N-channel MOS transistors MN7 to MN10, the first and second constant current sources I1 and I2 by the fifth and sixth constant current sources I5 and I6, the first to fourth transfer switch circuit sections SW1 to SW4 by the fifth to eighth transfer switch circuit sections SW5 to SW8, and the points 5a to 5j by the points 6a to 6j.

In the first output drive stage circuit section 830, the first power supply voltage $V_{DD}$ is connected to the break terminal of the first transfer switch circuit section SW1, the make terminal of the fifth transfer switch circuit section SW5, a positive side terminal of the first constant voltage source $V_{BP1}$, one terminal of the third constant current source I3, and a source of the sixth P-channel MOS transistor MP6. It should be noted that a line representing connections between the make terminal of the fifth transfer switch circuit section SW5 and the other components passes between FIGS. 5A and 5B through the point 5e. The other terminal of the third constant current source I3 is connected to the break terminal of the second transfer switch SW2, the make terminal of the sixth transfer switch circuit section SW6, a source of the fifth P-channel MOS transistor MP5, a drain of the fifth N-channel MOS transistor MN5, one terminal of the first resistance R1, and a gate of the sixth P-channel MOS transistor MP6. It should be noted that a line representing connections between the make terminal of the sixth transfer switch circuit section SW6 and the other components passes between FIGS. 5A and 5B through the point 5f. A negative side terminal of the first constant voltage source $V_{BP1}$ is connected to a gate of the fifth P-channel MOS transistor MP5. The other terminal of the first resistance R1 is connected to one terminal of the first capacitance C1. The other terminal of the first capacitance C1 is connected to one terminal of the second capacitance C2, the output node 833 of the first output drive stage circuit section 830, a drain of the sixth P-channel MOS transistor MP6, a drain of the sixth N-channel MOS transistor MN6, the break terminal of the ninth transfer switch circuit section SW9, and the make terminal of the tenth transfer switch circuit section SW10. It should be noted that a line representing connections between the break terminal of the ninth transfer switch circuit section SW9 and the other components passes between FIGS. 5A and 5B through the point 5j. Also, a line representing connections between the make terminal of the tenth transfer switch circuit section SW10 and the other components passes between FIGS. 5A and 5B through the point 5i. The other terminal of the second capacitance C2 is connected to one terminal of the second resistance R2. The other terminal of the second resistance R2 is connected to a gate of the sixth N-channel MOS transistor MN6, a source of the fifth N-channel MOS transistor MN5, one terminal of the fourth constant current source I4, a drain of the fifth P-channel MOS transistor MP5, the break terminal of the third transfer switch circuit section SW3, and the make terminal of the seventh transfer switch circuit section SW7. It should be noted that a line representing connections between the make terminal of the seventh transfer switch circuit section SW7 and the other components passes between FIGS. 5A and 5B through the point 5a. A gate of the fifth N-channel MOS transistor MN5 is connected to a positive side terminal of the second constant voltage source $V_{BN1}$. A negative side terminal of the second constant voltage source $V_{BN1}$ is connected to the other terminal of the fourth constant current source I4, a source of the sixth N-channel MOS transistor MN6, the second power supply voltage $V_{MS}$, the break terminal of the fourth transfer switch circuit section SW4, and the make terminal of the eighth transfer switch circuit section SW8. It should be noted that a line representing connections between the make terminal of the eighth transfer switch circuit section SW8 and the other components passes between FIGS. 5A and 5B through the point 5b.

Connection relation between the components in the second output drive stage circuit section 840 is the same as that of the above-described first output drive stage circuit section 830, and therefore detailed description of them is omitted. However, it should be noted that the fifth and sixth P-channel MOS transistors MP5 and MP6 should be replaced by the eleventh and twelfth P-channel MOS transistors MP11 and MP12, the fifth and sixth N-channel MOS transistors MN5 and MN6 by the eleventh and twelfth N-channel MOS transistors MN11 and MN12, the third and fourth constant current sources I3 and I4 by the seventh and eighth constant current sources I7 and I8, the first and second constant voltage sources $V_{BP1}$ and $V_{BN1}$ by the third and fourth constant voltage sources $V_{BP2}$ and $V_{BN2}$, the first to fourth transfer switch circuit sections SW1 to SW4 by the fifth to eighth transfer switch circuit sections SW5 to SW8, the fifth to eighth transfer switch circuit sections SW5 to SW8 by the first to fourth transfer switch circuit sections SW1 to SW4, the ninth and tenth transfer switch circuit sections SW9 and SW10 by the tenth and ninth transfer switch circuit sections SW10 and SW9, the first and second resistances R1 and R2 by the third and fourth resistances R3 and R4, the first and second capacitances C1 and C2 by the third and fourth capacitances C3 and C4, the points 5e, 5f, 5j, 5i, 5a, and 5b by the points 5d, 5c, 5i, 5j, 5h, and 5g.

Referring to FIGS. 5A and 5B, the operation of the operational amplifier according to the present embodiment will be described. First, it is assumed that the first input node 811 of the first input differential stage circuit section 810 is supplied with a positive side voltage in a voltage range of $V_{DD}/2$ to $V_{DD}$. In this case, states of the respective transfer switch circuit sections SW1 to SW14 are as illustrated in FIGS. 5A and 5B. In this case, a power supply for a differential pair including the third and fourth P-channel MOS transistors MP3 and MP4 in the first input differential stage circuit section 810 operates in the range of $V_{DD}/2$ to $V_{DD}$.

As an output stage for this case, the first output drive stage circuit section 830 is selected, which is a positive only output stage. That is, the drain of the N-channel MOS transistor MN4, which serves as a single end output of the above differential pair, and the gate of the N-channel MOS transistor MN6, which is one of inputs of the positive only output stage, are connected to each other.

In this state, a voltage between the source and drain of the above N-channel MOS transistor MN4 corresponds to a voltage between the source and gate of the N-channel MOS transistor MN6, and takes a voltage value of about a threshold voltage, i.e. $V_T+\alpha$. This causes source-drain voltages of the N-channel MOS transistors MN3 and MN4 constituting an active load for the above differential pair to be matched, which is a good state in terms of offset voltage. If the negative side power supply voltage for the above differential pair is the negative power supply voltage $V_{SS}$, i.e., the common terminal of the switch SW4 is connected to the negative power supply voltage $V_{SS}$, the source-drain voltage of the N-channel MOS transistor MN4, which is one of the components of the above active load, becomes approximately $V_{DD}/2+V_T+\alpha$, so that the source-drain voltages of the N-channel MOS transistors MN3 and MN4 of the active load for the above differential pair are not matched, and therefore a large offset voltage is generated.

On the other hand, the drain of the second P-channel MOS transistor MP2, which serves as a single end output in a differential pair including the first and second N-channel MOS transistors MN1 and MN2, and the gate of the sixth P-channel MOS transistor MP6 as a first input node of the first output drive stage circuit section, which is the positive only output stage, are connected to each other. In this state, a voltage between the source and the drain of the P-channel MOS transistor MP2 corresponds to a voltage between the source and the gate of the above sixth P-channel MOS transistor MP6, and also takes a voltage value of approximately a threshold $V_T+\alpha$.

As a result, source-drain voltages of the first and second P-channel MOS transistors MP1 and MP2 of an active load for the above differential pair are matched, which is a good state in terms of offset voltage. If a positive side power supply voltage for the above differential pair is connected through the first transfer switch circuit section SW1 with the power supply voltage $V_{MH}$ corresponding to approximately a half of the power supply voltage $V_{DD}$, the P-channel MOS transistors MP1 and MP2 of the above active load do not operate. This is because a voltage at the drain of the second P-channel MOS transistor MP2 becomes higher than a voltage at the source.

In this way, the respective transfer switch circuit sections SW1 to SW14 according to the present invention are switched such that all bias states become best.

Here, an operation of the output stage, i.e., the output drive stage circuit sections 830 and 840 will be described.

First, the third and fourth constant current sources I3 and I4 are configured to have a same current value. This is because the current flowing through the third constant current source I3 is divided into two by the fifth P-channel MOS transistor MP5 and fifth N-channel MOS transistor MN5 constituting a floating current source, and a total of the two flows through the fourth current source I4 to prevent excess current from flowing through the differential stages 810 and 820.

An operation in floating current sources in FIGS. 5A and 5B will be described. A combination of the fifth N-channel MOS transistor MN5 and the fifth P-channel MOS transistor MP5 operates as the so-called "floating current source". In a typical current source including transistors, one terminal is connected to a power supply terminal or a GND terminal. However, in the "floating current source", both terminals of the current source are in a floating state, and therefore can be connected to any nodes. The connections of the fifth N-channel MOS transistor MN5 and the fifth P-channel MOS transistor MP5 are locally applied with a current feedback of "1". For this reason, a common connecting point between the source of the transistor MN5 and the drain of the transistor MP5 and a common connecting point between the drain of the transistor MN5 and the source of the transistor MP5 respectively have high impedances because of the effect of the feedback. It can be seen also from this that the floating current source is configured.

Here, bias design of the floating current source will be described. First, a voltage $V_{BN1}$ between the power supply voltage $V_{MS}$ and a bias voltage terminal BN1 is equal to the sum of the gate-source voltage of the sixth N-channel MOS transistors MN6, which is an output transistor, and a gate-source voltage of the fifth N-channel MOS transistor MN5. From this, the following equation is met:

$$V_{BN1}=V_{GS(MN5)}+V_{GS(MN6)} \quad (1)$$

where $V_{GD(MN5)}$ is the gate-source voltage of MN5, and $V_{GS(MN6)}$ is the gate-source voltage of MN6.

In general, a gate-source voltage of an MOS transistor is expressed by the following equation:

$$V_{GS}=(2I_D/\beta)^{1/2}-V_{TO}+\gamma V_B^{1/2} \quad (2)$$

where $$\beta=(W/L)\mu C_O \quad (2a)$$

$$\gamma=((2\epsilon_O\epsilon_S qN_A)^{1/2})/C_O \quad (2b)$$

$$C_O=\epsilon_O\epsilon_S/t_O \quad (2c)$$

Here, W is a gate width, L is a gate length, $\mu$ is a mobility, $C_O$ is a capacitance per unit area in a gate oxide film, $V_{TO}$ is a threshold at $V_B=0$, $V_B$ is a back gate voltage, $\epsilon_O$ is a free space permittivity ($8.86 \times 10^{-14}$ F/cm), $\epsilon_S$ is a relative permittivity of semiconductor (e.g. 3.9), q is an electric charge of an electron ($1.6 \times 10^{-12}$ coulombs), $t_O$ is a gate oxide film thickness, $N_A$ is an acceptor density, and $\gamma$ is a value depending on a process, of which an average value is approximately 0.5.

The bias voltage $V_{BN1}$ is determined on the basis of the above equations (1) and (2) such that a drain current ($I_D$) has a desired value. In this case, a circuit for generating the bias voltage $V_{BN1}$ typically includes an N-channel MOS transistor to suppress a variation in bias current due to a variation in threshold $V_T$ of a transistor. It should be noted that in FIGS. 5A and 5B, the transistor for preventing the variation is not illustrated.

Regarding the fifth and sixth P-channel MOS transistors MP5 and MP6, the same bias design can also be applied. Therefore, description thereof is omitted.

Next, a phase compensation will be described. The first and second capacitances C1 and C2 and the first and second resistances R1 and R2 operate as a phase compensation circuit. Such a phase compensation circuit is obvious to a person skilled in the art, and not directly related to the present invention, and therefore the description is omitted.

Also, regarding a differential stage B that is the second input differential stage circuit section 820, and a negative only output stage that is the second output drive stage circuit section 840, as described above, switching is made by use of the switches such that a relation between a single end output of each differential stage and an input of each output stage entirely operate well. Regarding this, the same description as in the differential stage A and the positive only output stage can be applied. Therefore, the description thereof is omitted.

The operational amplifier circuit section 80 according to the present embodiment is further provided with ninth and tenth transfer switch circuit sections SW9 and SW10 for voltage follower connections. In the switch states as shown in FIGS. 5A and 5B, the differential stage A and the positive only output stage form a voltage follower connection, to output a voltage supplied to the differential stage A from an output terminal Vout of the positive only output stage. Further, the differential stage B and the negative only output stage also form a voltage follower connection, to output a voltage supplied to the differential stage B from an output terminal Vout of the negative only output stage.

On the other hand, if the states of the ninth and tenth transfer switch circuit sections SW9 and SW10 are switched to be brought to states opposite to the states shown in FIGS. 5A and 5B, the differential stage A and the negative only output stage form a voltage follower connection, to a voltage supplied to the differential stage A from the output terminal Vout of the negative only output stage. Further, the differential stage B and the positive only output stage also form a voltage follower connection, to output a voltage supplied to the differential stage B from the output terminal Vout of the positive only output stage.

It should be noted that the first, fourth, fifth, and eighth transfer switch circuit sections SW1, SW4, SW5, and SW8 operate as switches for power supply switching, and currents flow through these transfer switch circuit sections. However, it is in the differential stage that the currents flow through the switches. A current in a differential stage of the operational amplifier used for a typical LCD driving circuit is approximately 1 μA, and therefore voltage drops generated due to the switches are almost negligible. If such switches are inserted for the power supply voltages in the output stage, a current flowing through the output stage is larger by two orders than the current flowing through the differential stage, and therefore voltage drops due to the switches are not negligible. One feature of the operational amplifier circuit section 80 according to the present invention is in that the voltage drops due to the currents flowing through the switches are almost negligible.

Figure 1:
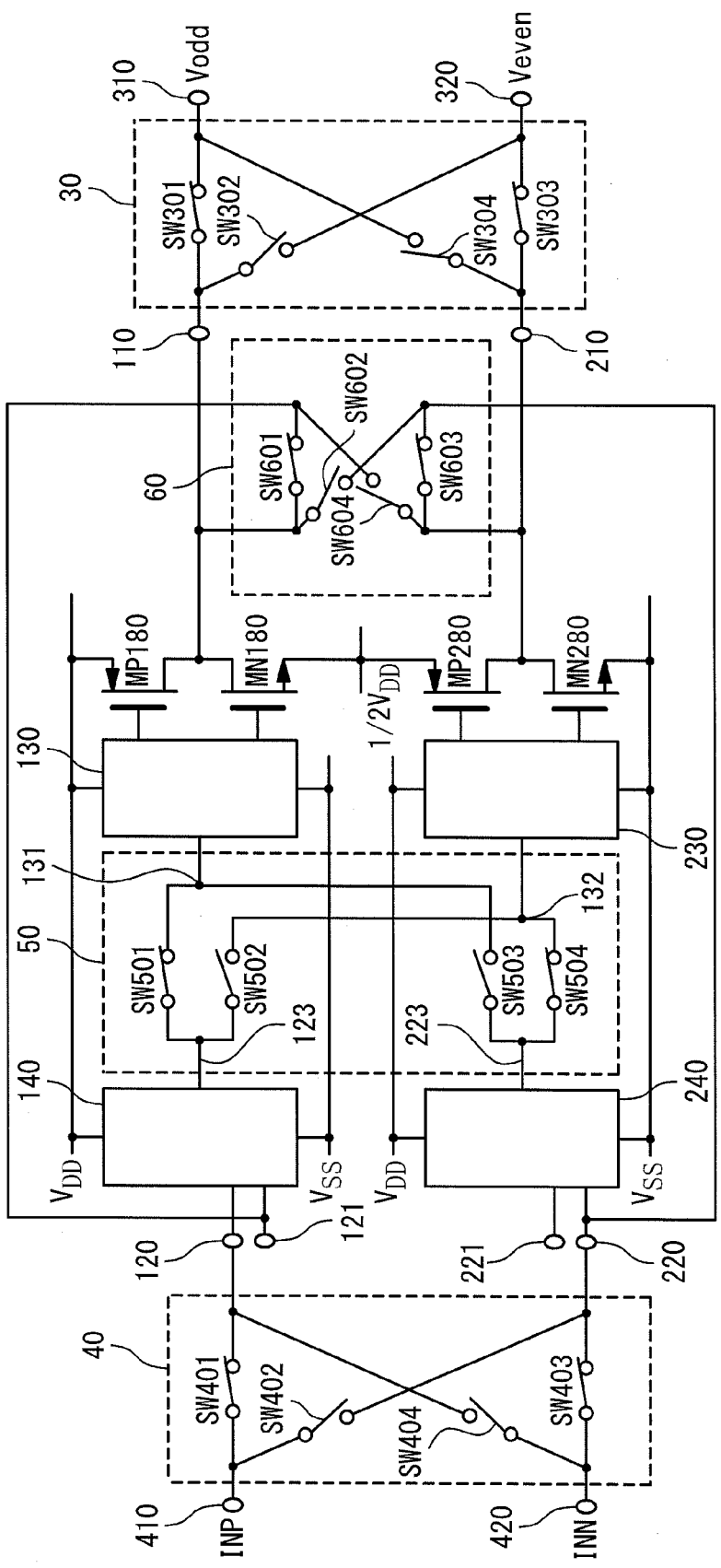
FIG. 1 is a circuit showing a configuration of an operational amplifier circuit shown in Patent literature 1.
Figure 2:
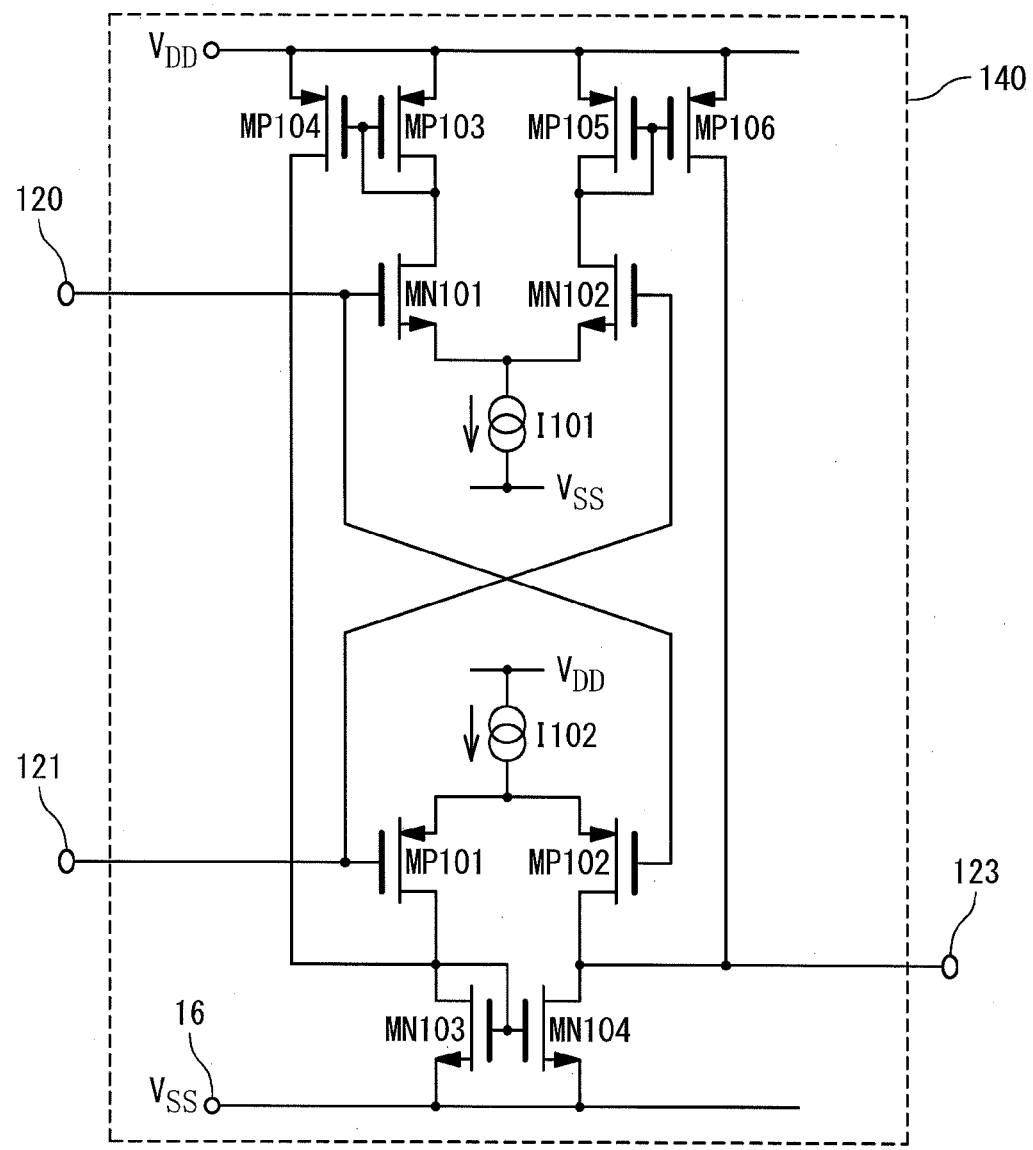
FIG. 2 is a circuit showing a configuration of a differential type input stage circuit of the operational amplifier shown in FIG. 1.
Figure 3:
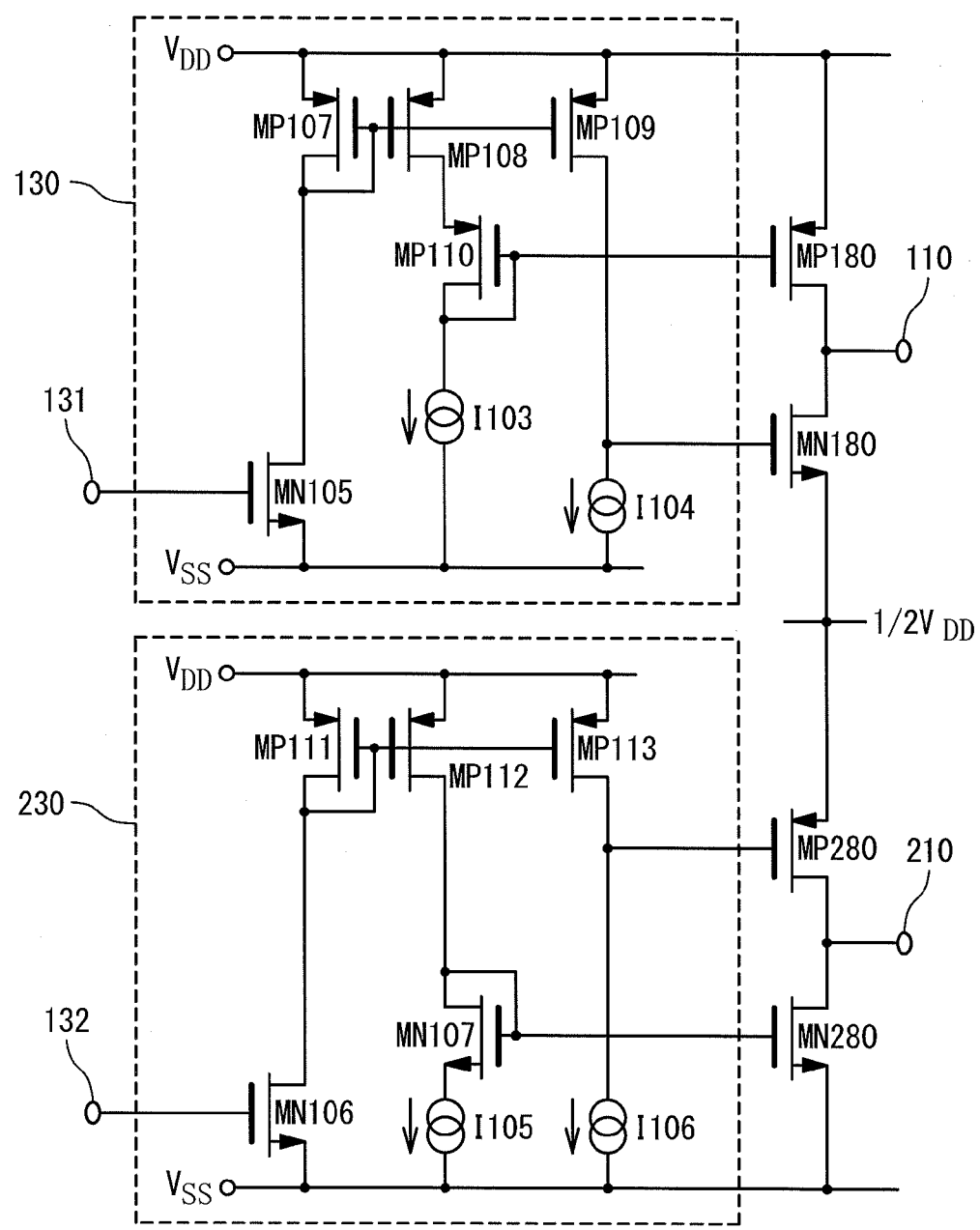
FIG. 3 is a circuit showing a configuration of a drive stage circuit described of the operational amplifier shown in FIG. 1.

FIGS. 7A-1 to 7A-4, and 7B-1 to 7B-4 are circuit diagrams showing configuration examples of the transfer switch circuit section used in the operational amplifier according to the present invention. FIG. 7A-1 is a circuit diagram schematically showing a make type switch circuit section, and FIG. 7A-2 is a circuit diagram showing the make type switch circuit section with use of an N-channel MOS transistor. FIG. 7A-3 is a circuit diagram showing the make type switch circuit section with use of a P-channel MOS transistor, and FIG. 7A-4 is a circuit diagram showing the make type switch circuit section with use of two types of MOS transistors. FIG. 7B-1 is a circuit diagram schematically showing a transfer switch circuit section, and FIG. 7B-2 is a circuit diagram showing the transfer switch circuit section with use of N-channel MOS transistors. FIG. 7B-3 is a circuit diagram showing the transfer switch circuit section with use of N-channel MOS transistors, and FIG. 7B-4 is a circuit diagram showing the transfer switch circuit section with use of two types of MOS transistors.

FIGS. 7A-2 and 7A-3 will be described. Both terminals of the make type switch respectively correspond to a drain and a source of an N-channel or P-channel MOS transistor. Also, it is assumed that ON/OFF control of the switch is performed through a gate. In the case of the N-channel MOS transistor, when the gate is in a high level, the switch is closed, whereas when the gate is in a low level, the switch is turned OFF. In the case of the P-channel MOS transistor, the operation is opposite to the above, in which when the gate is in the low level, the switch is closed, whereas when the gate is in the high level, the switch is turned OFF.

FIG. 7A-4 will be described. This switch circuit is provided with an N-channel MOS transistor, a P-channel MOS transistor, and an inverter circuit. The N-channel and P-channel MOS transistors form a combined circuit. That is, a drain of the N-channel MOS transistor and a drain of the P-channel MOS transistor are connected to each other, and further connected to one terminal of the make type switch. Similarly, a source of the N-channel MOS transistor and a source of the P-channel MOS transistor are connected to each other, and further connected to the other terminal of the make type switch. A control terminal of the switch circuit is connected to an input section of the inverter circuit section and a gate of the N-channel MOS transistor. An output section of the inverter circuit section is connected to a gate of the P-channel MOS transistor.

In other words, the switch circuit in FIG. 7A-4 is configured such that, in the N-channel and P-channel MOS transistors combined circuit, the respective drains of the N-channel MOS transistor and the P-channel MOS transistor are connected in common, and the respective sources of the N-channel and the P-channel are connected in common, and the respective gates are driven by signals having opposite phases with use of the inverter. In this case, when the gate of the N-channel MOS transistor is in the high level, the gate of the P-channel MOS transistor is in the low level because of the inverter, and both of them are turned ON. That is, the switch is turned ON. On the other hand, when the gate of the N-channel MOS transistor is in the low level, the gate of the P-channel is in the high level because of the inverter, and both of them are turned OFF. That is, the switch is turned OFF.

A break type switch can be realized by inversion of control logic of the above-described make type switch. The same matter as in the make type can be applied, and therefore description thereof is omitted.

FIG. 7B-2 will be described. This transfer switch circuit section is configured such that respective sources of two N-channel MOS transistors are connected to each other, and the connecting point is used as a common point. Also, drains of the two N-channel MOS transistors are respectively used as first and second terminals, i.e., break and make terminals. Gates of the two N-channel MOS transistors are respectively connected to input and output sections of an inverter circuit section. By connecting a control terminal of the transfer switch circuit section to the input section of the inverter circuit section, the two N-channel MOS transistors are supplied with control signals having opposite phases. More detailed operation in each of the two N-channel MOS transistors is the same as that for the case of FIG. 7A-2, and therefore description thereof is omitted.

FIG. 7B-3 will be described. This transfer switch circuit section is the same as that for the case of FIG. 7B-2 except for using two P-channel MOS transistors, and therefore detailed description is omitted. Also, detailed operation in each of the two P-channel MOS transistors is the same as that for the case of FIG. 7A-3, and therefore description thereof is omitted.

FIG. 7B-4 will be described. This transfer switch circuit section is the same as that for the case of FIG. 7B-2 or 7B-3, excluding use of two combined structures each including an N-channel MOS transistor and a P-channel MOS transistor, and therefore detailed description is omitted.

Whether an N-channel MOS transistor, a P-channel MOS transistor, or a combined circuit including an N-channel MOS transistor and a P-channel MOS transistor should be used as the transfer switch circuit section used in the operational amplifier according to the present invention, depends on a voltage in each of the transfer switch circuit sections. For example, supposing that a power supply voltage is $V_{DD}$, it is preferable that, if a voltage applied to a switch is higher than approximately $V_{DD}/2$, the P-channel MOS transistor is used, whereas if the voltage applied to the switch is lower than approximately $V_{DD}/2$, the N-channel MOS transistor is used, and further if it is necessary to perform operation in the entire input voltage range of $V_{SS}$ (GND) to $V_{DD}$, the combined circuit including an N-channel MOS transistor and a P-channel MOS transistor is used.

It should be noted that the switch circuits described in FIGS. 7A-1 to 7B-4 are only examples, and a configuration of the present invention is not limited to any of them.

The differential stage in the conventional example shown in FIG. 2 is provided with a combination of MN101 and MN102, a combination of MP101 and MP102, a combination of MN103 and MN104, a combination of MP103 and MP104, and a combination of MP105 and MP106. In the five combinations of transistors, a variation in threshold of a transistor affects an offset voltage of an amplifier. In the conventional example, as compared with a configuration of a typical P/N combined differential stage, the number of transistors is larger, and consequently the offset voltage is large. Accordingly, if the circuit according to the conventional example is used as the LCD driver, a deviation characteristic may be degraded.

Further, in the conventional example, as can be seen from the configuration in FIG. 3, the number of paths that determine a static current consumption amount is as many as three, even excluding the output stage. That is, the three paths are a path through MP107, a path through MP108, and a path through MP109. As a result, the conventional example has a problem of a large power consumption amount.

Further, referring to FIG. 3, between a drain-source voltage of the PMOS transistor MP109 in the drive stage circuit 130 and a drain-source voltage of a PMOS transistor MP209 in the drive stage circuit 230, there is a voltage difference of approximately $V_{DD}/2$. Drain currents of the two P-channel MOS transistors MP109 and MP209 represent different values due to the voltage difference and output resistances in pentode regions of the transistors. That is, the drive stage circuits 130 and 230 represent different output characteristics.

Further, an application range of the configuration in the conventional example is limited to the circuit illustrated in the conventional example, and the configuration cannot be applied to the other typical operational amplifier circuit.

According to the operational amplifier and the LCD driving circuit for driving a liquid crystal display apparatus by use of the operational amplifier, and the liquid crystal display apparatus according to the present embodiment, the problems of the conventional example are all solved. That is, the number of combinations of transistors having a variation in threshold, which affects an offset voltage of an amplifier, is only four. That is, the four combinations are a combination of MN1 and MN2, a combination of MP1 and MP2, a combination of MP3 and MP4, and a combination of MN3 and MN4, which achieve the reduction of one combination from the five combinations in the conventional example. Thus, the offset voltage can be more improved than that in the conventional example.

Also, in the operational amplifier circuit section 80 according to the present embodiment, the number of current paths in the first stage is only two, i.e., I1 and I2. Further, even in the output stage, the number of current paths is only two. As described, according to the present embodiment, a current consumption amount can be made lower than that in the conventional example.

Also, in the operational amplifier circuit section 80 according to the present embodiment, there is no case where a high voltage is applied to a specific transistor to make a circuit asymmetric as in the conventional example.

Further, the present embodiment can be applied to the other circuits, and has advantages that the circuit limitation as in the conventional example is absent, and so on.

Second Embodiment

Figure 6A:
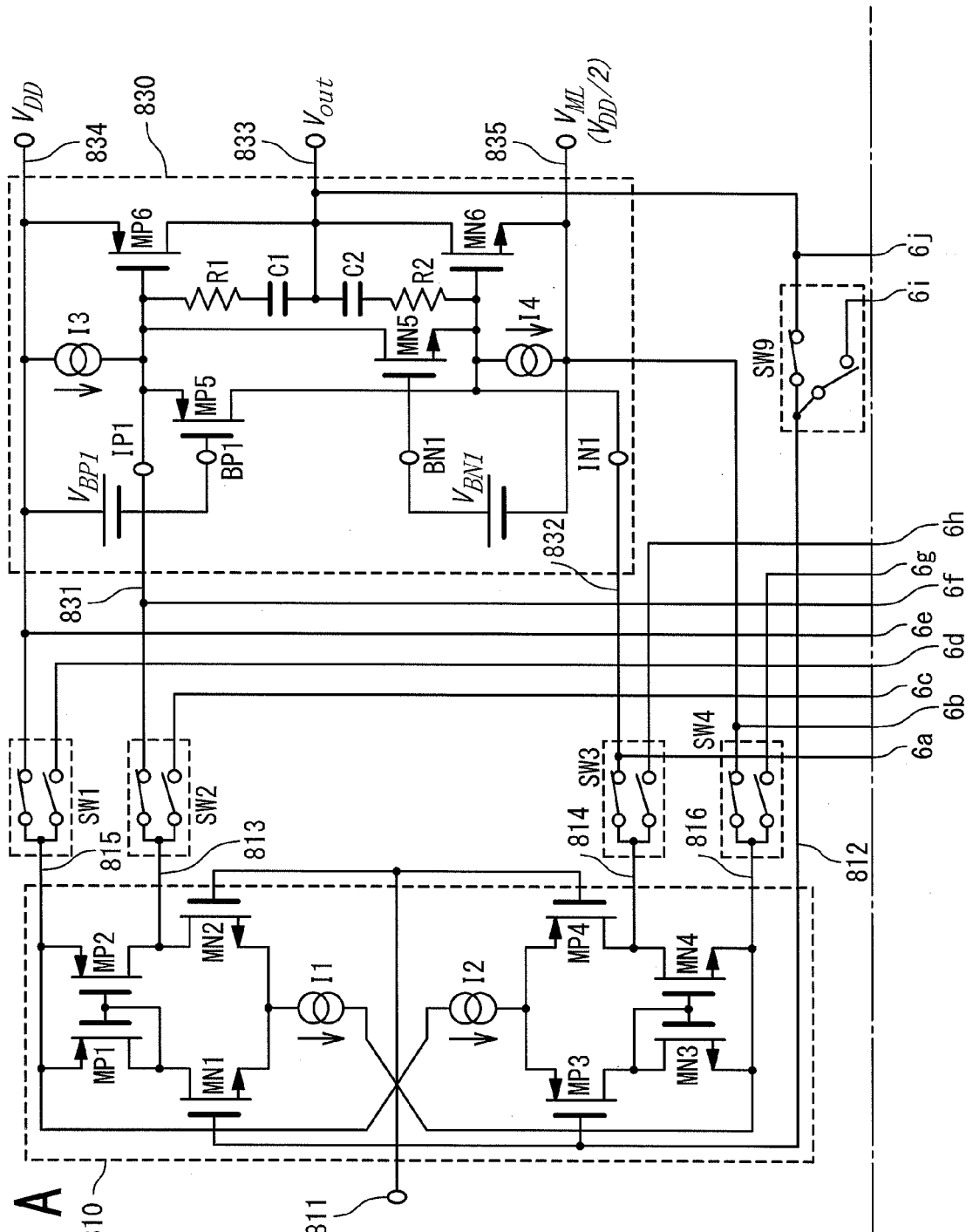
FIGS. 6A and 6B are a circuit diagram showing a configuration of an operational amplifier circuit section in the operational amplifier according to a second embodiment of the present invention.
Figure 6B:
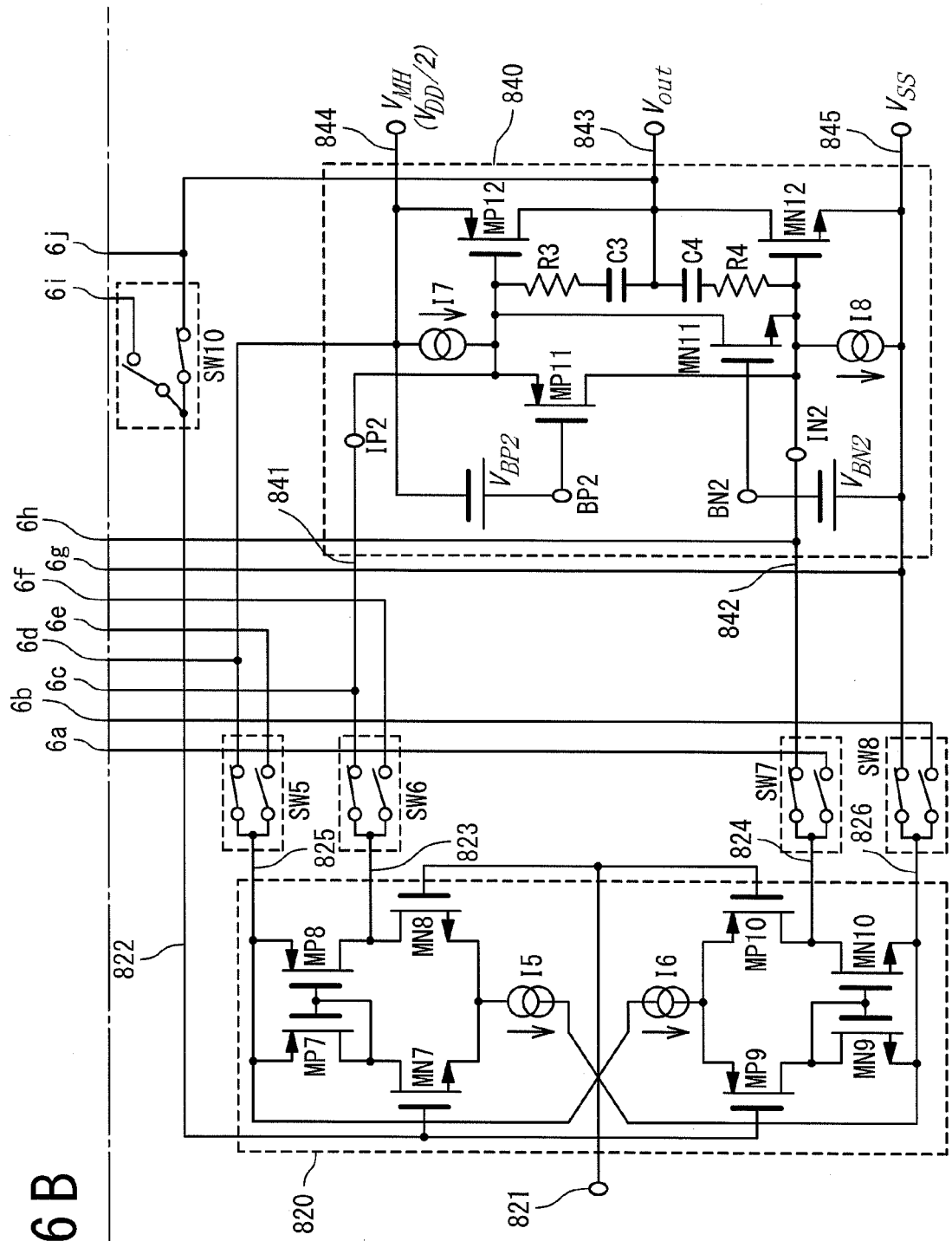

FIGS. 6A and 6B are circuit diagrams showing a configuration of the operational amplifier circuit section 80 according to a second embodiment of the present invention. It should be noted that FIGS. 6A and 6B illustrate one circuit diagram separated into two diagrams. Reference numerals 6a to 6j are notations for specifying ten lines divided between the both diagrams. In addition, an entire configuration of the operational amplifier according to the present embodiment is the same as that in the first embodiment of the present invention, which is as described with use of the above-described FIG. 4, and therefore further description is omitted.

The configuration of the operational amplifier circuit section 80 according to the present embodiment is almost the same as that of the operational amplifier circuit section 80 according to the first embodiment of the present invention. However, the present embodiment is different from the first embodiment in the following four points. That is, in a first input differential stage circuit section 810, one terminal of the first constant current source I1 is connected to sources of third and fourth N-channel MOS transistors MN3 and MN4 and the common terminal of the fourth transfer switch circuit section SW4, instead of being connected to the fourth power supply voltage $V_{SS}$. Similarly, one terminal of the second constant current source I2 is connected to sources of first and second P-channel MOS transistors MP1 and MP2 and the common terminal of the first transfer switch circuit section SW1, instead of being connected to the first power supply voltage $V_{DD}$. Also, in a second input differential stage circuit section 820, one terminal of the fifth constant current source I5 is connected to sources of ninth and tenth N-channel MOS transistors MN9 and MN10 and the common terminal of the eighth transfer switch circuit section SW8, instead of being connected to the fourth power supply voltage $V_{SS}$. Similarly, one terminal of the sixth constant current source I6 is connected to respective sources of seventh and eighth P-channel MOS transistors MP7 and MP8 and the common terminal of the fifth transfer switch circuit section SW5, instead of being connected to the first power supply voltage $V_{DD}$.

The configuration of the operational amplifier circuit section 80 according to the present embodiment is the same as that in the first embodiment, except for the above four points, and therefore further description is omitted.

Referring to FIGS. 6A and 6B, the operation of the operational amplifier according to the present embodiment will be described.

A difference between the present embodiment illustrated in FIGS. 6A and 6B and the first embodiment illustrates in FIGS. 5A and 5B is in the power supply voltages applied to a differential pair circuit. That is, in the first embodiment, the voltage applied to the differential pair circuit which includes the first current source I1, the differential pair transistors MN1/MN2, and the transistors MP1/MP2 serving as the active load for the differential pair is $V_{DD}$ when the transfer switch circuit sections are in the first state, or approximately $V_{DD}/2$ when they are in the second state. On the other hand, in the second embodiment, a voltage applied to a corresponding differential pair circuit is constantly approximately $V_{DD}/2$.

This leads to a possibility that source-drain voltages of all transistors to operate are approximately $V_{DD}/2$ or less. That is, there is an advantage that a required transistor breakdown voltage is only a half, which then leads to a reduction in cost.

In the above, one of two differential pairs present in the first input differential stage circuit section 810 has been described. However, the same holds true for the other differential pair (which includes the second current source I2, differential pair transistors MP3/MP4, and transistors MN3/MN4 serving as an active load for the differential pair). Similarly, the same holds true for two differential pairs present in the second input differential stage circuit section 820. Detailed description of each of them is omitted.

The operation of the operational amplifier in the present embodiment other than the above-mentioned operation is also the same as that in the above-described first embodiment, and therefore detailed description thereof is omitted.

As has been described above, the operational amplifier of the present invention has an advantage of being easily achieved in any type of operational amplifier by switching the power supply voltage applied to the differential stage to match the differential stage to an input level of the output stage. The conventional example can be realized only with the specific circuit configuration shown in the conventional example, but cannot be applied in any other circuit (e.g., the operational amplifier circuit illustrated in the first embodiment).

Since a current flowing through a switch inserted in series in the power supply for the differential stage is small, and therefore a voltage drop by the switch is small, resulting in small influence on the circuit.

Further, by employing the circuit configuration according to the second embodiment, a voltage applied to a transistor can be reduced to approximately a half of the power supply voltage. This results in a reduction in breakdown voltage of the transistor, so that a chip size can be reduced if the configuration is realized as an LSI. That is, cost can be reduced.

Still further, there is also an advantage that the circuit configuration of the differential stage is a P/N symmetrical configuration, and therefore an output transient characteristic waveform is also symmetrized, so as to meet characteristics required for an LCD source driver.

Yet further, there is an advantage also from the view of a current consumption amount that the configuration of the first or second embodiment has a small number of current paths as compared with the conventional example, and therefore an operational amplifier circuit having a low current consumption amount can be configured.

The operational amplifier of the present invention is suitable to an output amplifier of the LCD driving circuit. In the current situation that an LCD driving circuit having the outputs exceeding 1000 (channels) is recently developed, a voltage follower connected operational amplifier is required for the number of channels in the conventional example. Accordingly, 1000 times as much as a power consumption amount by one operational amplifier is equivalent to a power consumption amount of one chip. When the number of outputs is large as described, the power consumption amount of the chip is increased, and a chip temperature may be elevated close to 150° C. that is equivalent to a limitation of silicon. Even in such a sense, by using the operational amplifier of the present invention, the power consumption amount can be reduced.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. A display driving circuit for use with a display panel, comprising:
a plurality of operational amplifiers, each having a first operation mode and a second operation mode and including:
  a first input node;
  a second input node;
  a first output node;
  a second output node;
  a control unit configured to switch an operation mode between the first operation mode and the second operation mode;
  an input section configured to receive input signals and supply one of the input signals as a first input signal to the first input node in the first operation mode and to the second input node in the second operation mode and the other of the input signals as a second input signal to the first input node in the second operation mode and to the second input node in the first operation mode;
  a first differential circuit section configured to differentially-amplify the first input signal supplied through the first input node in the first operation mode, and the second input signal supplied through the first input node in the second operation mode;
  a second differential circuit section configured to differentially-amplify the second input signal supplied through the second input node in the first operation mode, and the first input signal supplied through the second input node in the second operation mode;
  a first output drive circuit section configured to amplify the differentially-amplified first input signal by the first or the second input differential circuit section to output as a first drive voltage;
  a second output drive circuit section configured to amplify the differentially-amplified second input signal by the first or the second input differential circuit section to output as a second drive voltage;
  an output section configured to output through the first output node, the first drive voltage in the first operation mode and the second drive voltage in the second operation mode, and to output through the second output node, the second drive voltage in the first operation mode and the first drive voltage in the second operation mode;
  first and second power supply voltage input nodes configured to supply voltages in a first voltage range to the first differential circuit section and the first output drive circuit section in the first operation mode, and to supply voltages in the first voltage range to the second differential circuit section and the first output drive circuit section in the second operation mode; and
  third and fourth power supply voltage input nodes configured to supply voltages in a second voltage range which is different from the first voltage range, to the second differential circuit section and the second output drive circuit section in the first operation mode, and to supply voltages in the second voltage range in the first differential circuit section and the second output drive circuit section in the second operation mode,
  wherein the first or the second drive voltage on the first output node is fed back to the first differential circuit section from one of the first and the second output drive circuit sections, and
  wherein the first or the second drive voltage on the second output node is fed back to the second differential circuit section from the other of the first and the second output drive circuit sections.

* * * * *